United States Patent
Bai et al.

(10) Patent No.: US 7,888,186 B2
(45) Date of Patent: Feb. 15, 2011

(54) METHOD FOR ASSEMBLING STACKABLE SEMICONDUCTOR PACKAGES

(75) Inventors: Zhigang Bai, Tianjin (CN); Weimin Chen, Tianjin (CN); Zhijie Wang, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 105 days.

(21) Appl. No.: 12/499,788

(22) Filed: Jul. 8, 2009

(65) Prior Publication Data
US 2010/0317152 A1 Dec. 16, 2010

(30) Foreign Application Priority Data
Jun. 16, 2009  (CN) .................... 2009 1 0149320

(51) Int. Cl.
*H01L 21/00* (2006.01)
(52) U.S. Cl. ............... 438/124; 29/25.01; 257/E21.499
(58) Field of Classification Search ................. 438/107, 438/124; 29/25.01; 257/E21.499, E25.027
See application file for complete search history.

(56) References Cited

U.S. PATENT DOCUMENTS

| | | | |
|---|---|---|---|
| 6,889,093 B1 | 5/2005 | Flammang | |
| 7,098,073 B1 | 8/2006 | Mangrum | |
| 7,196,427 B2 | 3/2007 | Mangrum | |
| 7,211,466 B2 | 5/2007 | Lo et al. | |
| 7,264,997 B2 * | 9/2007 | Kameyama et al. | 438/113 |
| 7,378,298 B2 | 5/2008 | Lo | |
| 7,781,899 B2 * | 8/2010 | Sim et al. | 257/787 |
| 2003/0111734 A1 * | 6/2003 | Kobayashi et al. | 257/774 |
| 2004/0157362 A1 * | 8/2004 | Beroz et al. | 438/106 |
| 2005/0167814 A1 * | 8/2005 | Beroz et al. | 257/687 |
| 2006/0275949 A1 * | 12/2006 | Farnworth et al. | 438/106 |
| 2007/0216006 A1 | 9/2007 | Park et al. | |
| 2008/0108179 A1 | 5/2008 | Mistry et al. | |
| 2008/0246126 A1 | 10/2008 | Bowles et al. | |
| 2009/0057885 A1 * | 3/2009 | Theuss | 257/723 |
| 2010/0171207 A1 * | 7/2010 | Shen et al. | 257/686 |

OTHER PUBLICATIONS

John H. Lau et al, Mitusbishi Molded WLP, Chip Scale Package: Design, Materials, Process, Reliability, and Applications, Feb. 28, 1999, p. 496-499, McGraw-Hill Professional, 1 edition.

* cited by examiner

*Primary Examiner*—Fernando L Toledo
(74) *Attorney, Agent, or Firm*—Charles Bergere

(57) ABSTRACT

A method for assembling a stackable semiconductor package includes providing a substrate having a first surface and a second surface. The first surface includes bond pads and one or more die pads. Conductive bumps are formed on the bond pads and one or more semiconductor dies are attached to the one or more die pads. The first surface of the substrate, the semiconductor dies and the conductive bumps are placed in a side-gate molding cast and a mold material is supplied to the first surface of the substrate to form a stackable semiconductor package. Similarly formed semiconductor packages may be stacked, one on another to form a stacked semiconductor package.

14 Claims, 9 Drawing Sheets

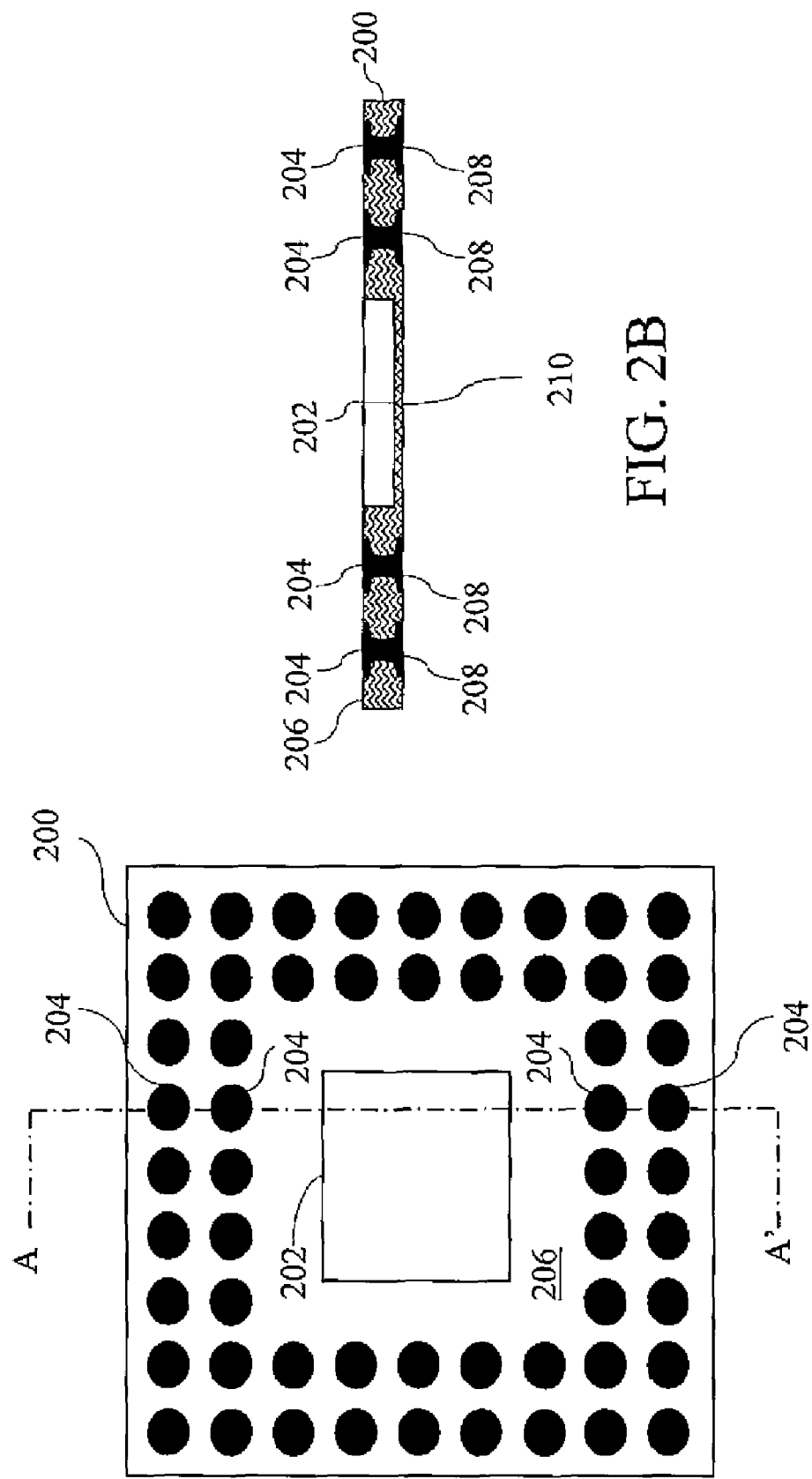

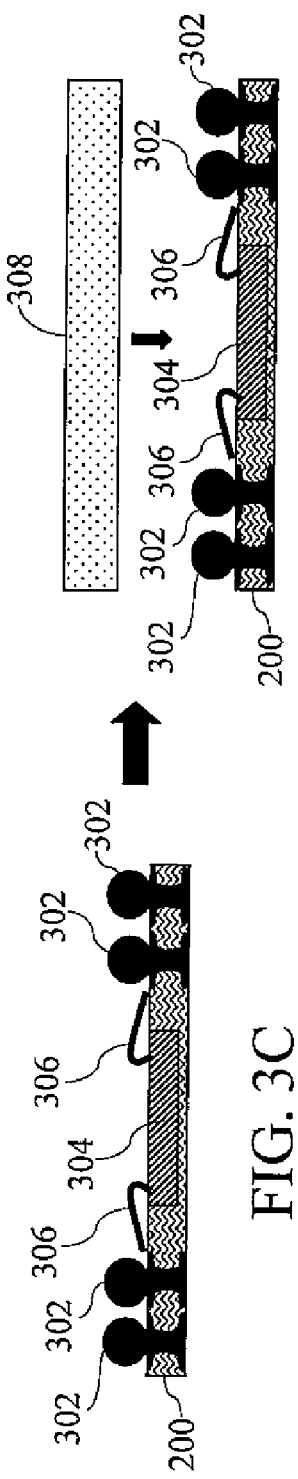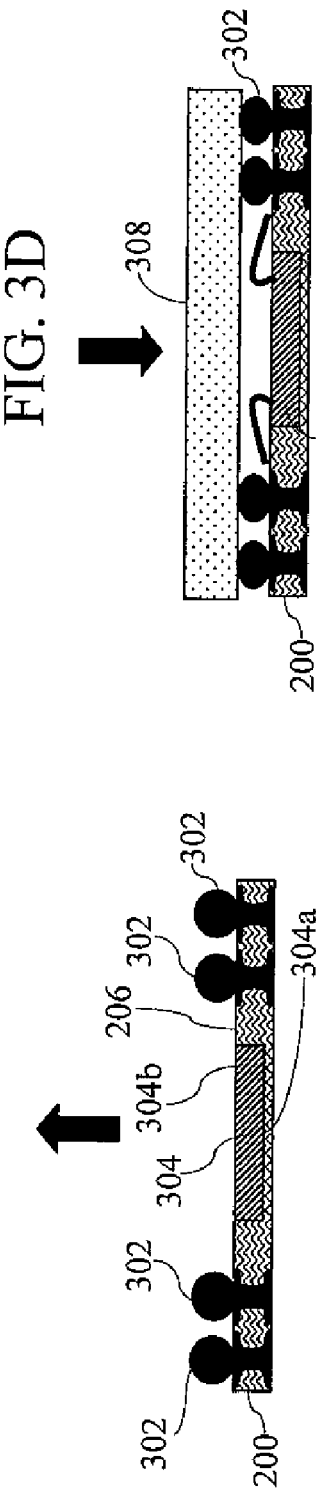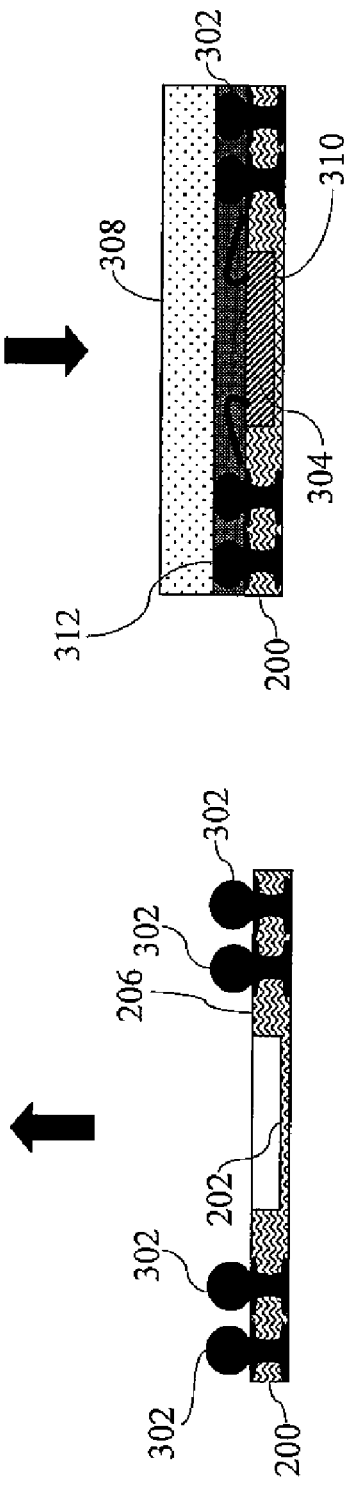

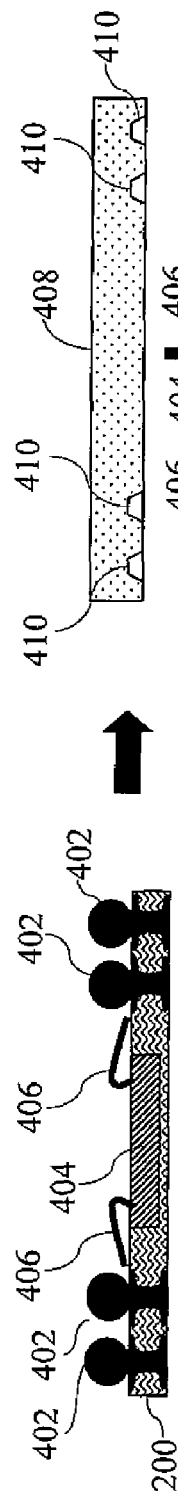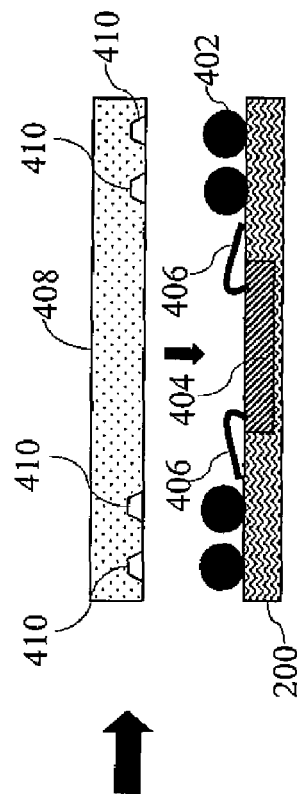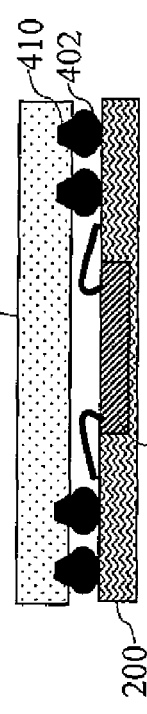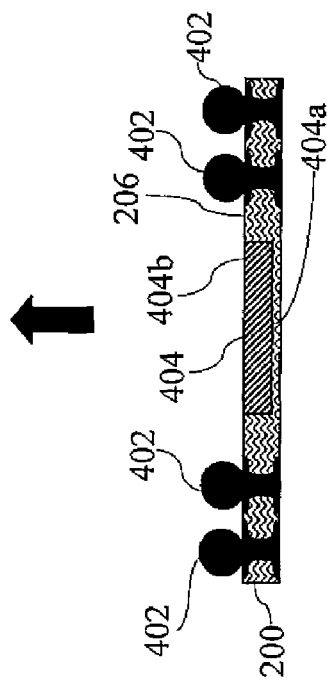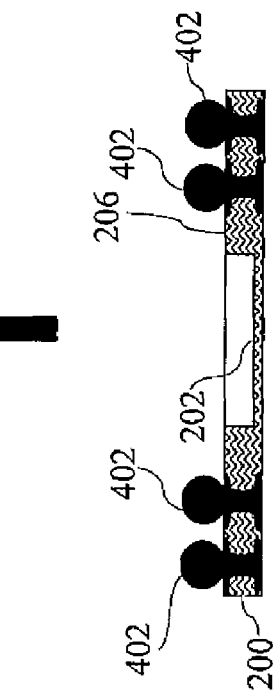

METHOD FOR ASSEMBLING STACKABLE SEMICONDUCTOR PACKAGES

BACKGROUND OF THE PRESENT INVENTION

The present invention relates generally to semiconductor packages and, more specifically, to a method and system for assembling stacked semiconductor packages.

Electronic devices such as mobile phones, personal digital assistants (PDA), and portable computers, are being designed to achieve the smallest possible size. Miniaturization of the electronic devices has increased the demand for small component footprints. A component footprint is defined as the space occupied by a component in an electronic device. Small component footprints have increased the popularity of stacked semiconductor packages.

Stacked semiconductor packaging is an advanced packaging technology that aids in making the electronic devices compact while maintaining high functionality and good performance. In a stacked package, individual semiconductor packages are stacked on top of one another. Each semiconductor package includes a substrate and a die attached on a surface of the substrate and electrically connected to the substrate. The die and the electrical connections also are encapsulated with a mold compound. The mold compound protects the die and the electrical connections from dust, moisture, mechanical stress, etc. Solder balls are formed over bond pads on the substrate. The solder balls provide an electrical interface for a second package stacked on the first package. Thus, a dense package structure is formed having a footprint of a single semiconductor package.

However, the distance between the first package and the second package, that is the substrate-to-substrate distance, should be greater than the bottom package encapsulation height in order to allow for good solder ball interconnection between the packages. Normally, the substrate-to-substrate distance is equal to the solder ball diameter, and the bottom encapsulation height is less than solder ball diameter. Hence, the height of the solder balls must be greater that that of the encapsulation, which increases the overall profile of the stacked package.

Referring now to FIG. 1, a schematic diagram illustrating a conventional center gate molding apparatus 100 for molding a semiconductor package is shown. The center gate molding apparatus 100 includes a runner 102, a gate 104, and a chase 106. The runner 102 is coupled with the gate 104. The gate 104 is located at the center of the chase 106. The semiconductor package includes a substrate 108 and a semiconductor die 110 attached on the substrate 108. The substrate 108 is electrically connected to the die 110 with wires 112 via wire bonding. The die 110 and the wires 112 are placed inside a cavity of the chase 106 for encapsulation with a mold compound 114. The runner 102 supplies the mold compound 114 to the gate 104. The mold compound 114 may include a non-conductive material such as epoxy and resin. Thereafter, the gate 104 injects the mold compound 114 into the cavity of the chase 106 to encapsulate the die 110 and the wires 112. Once the encapsulation is complete, the gate 104 is separated. During separation, the runner 102 and the gate 104 move upward while the chase 106 holds the now encapsulated die 110. However, since the mold compound 114 is viscid in nature, it can stick to the gate 104. Thus, the upward movement of the gate 104 may pull the mold compound 114 off the top surface of the package, thereby damaging the package. In some cases, the surface of the die 110 may become exposed, which adversely affects package reliability.

The efficiency of a semiconductor package design is primarily determined by the substrate utilization. However, with the apparatus described above, the chase 106 that surrounds the die 110 occupies a significant amount of surface area, which means the substrate must be larger than necessary. This reduces substrate utilization and ultimately, package efficiency. Further, the process, as described above, requires a unique molding apparatus based on the die and package sizes, which increases cost and reduces the flexibility of package design. Thus, it would be desirable to be able to assemble a stackable semiconductor package that has efficient substrate utilization in a reliable manner.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

FIG. 2A is a top view of a substrate in accordance with an embodiment of the present invention;

FIG. 2B is a cross-sectional side view of the substrate of FIG. 2A;

FIGS. 3A-3F are schematic diagrams illustrating various stages during fabrication of a semiconductor package, in accordance with an embodiment of the present invention;

FIGS. 4A-4F are schematic diagrams illustrating various stages during fabrication of a semiconductor package, in accordance with another embodiment of the present invention;

DETAILED DESCRIPTION OF THE PRESENT INVENTION

Figure 1:
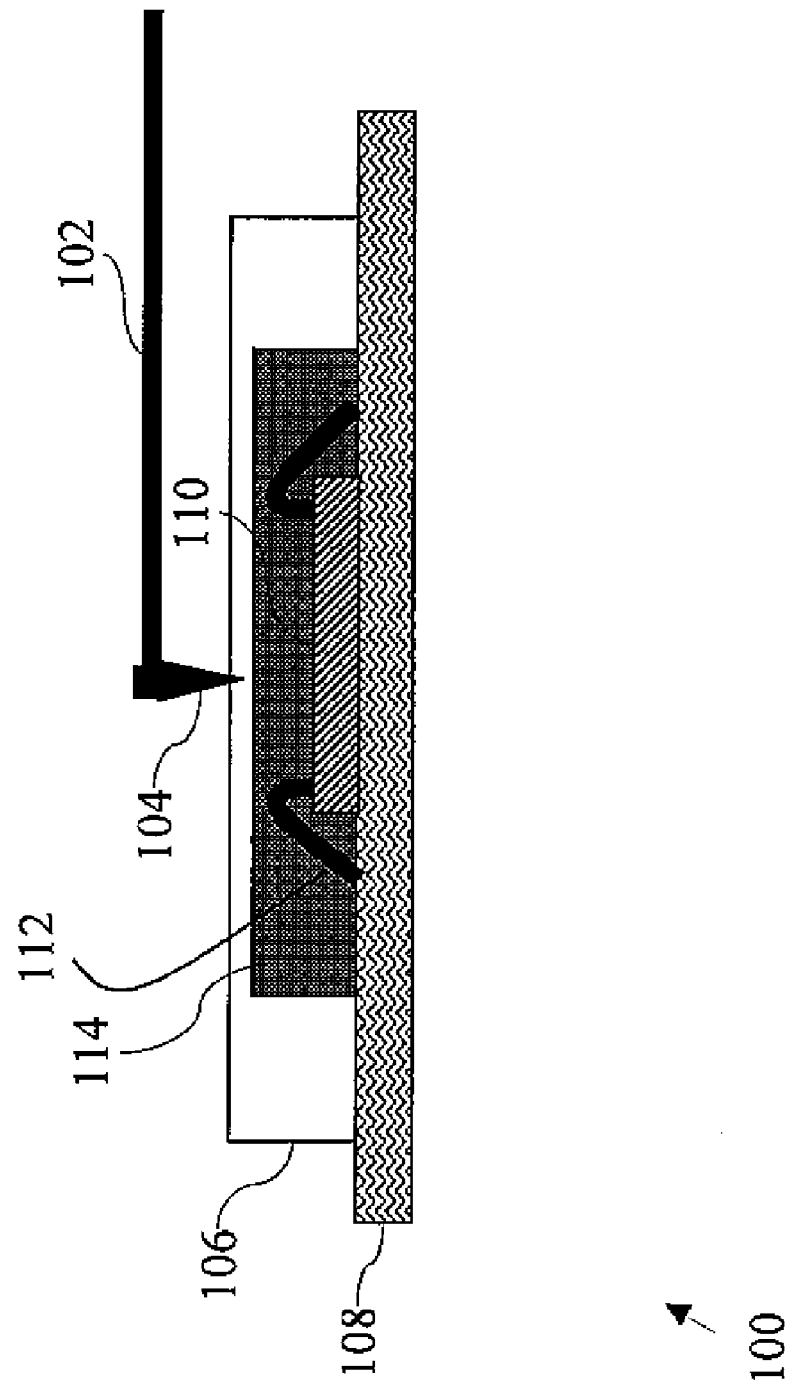
FIG. 1 is a schematic diagram of a conventional center gate molding apparatus.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for assembling a stacked semiconductor package includes providing a first substrate having a first surface and a second surface. The first surface includes a plurality of bond pads and one or more die pads. A plurality of conductive bumps is formed on the bond pads and one or more semiconductor dies are attached on the one or more die pads. The first substrate is placed in a side-gate molding cast. The molding cast surrounds the first surface of the first substrate, the semiconductor dies, and the conductive bumps. A mold material is supplied to the first surface of the first substrate. The mold material completely covers the semiconductor dies and at least partially covers the conductive bumps. Further, a portion of each of the conductive bumps is exposed to provide electrical connection to a second semiconductor package. Hence, a first semiconductor package having a first boundary layer and a second boundary layer is formed. The first boundary layer is delineated by a first surface of the mold material and the exposed portion of the plurality of conductive bumps. The second boundary layer is delineated by the second surface of the first substrate.

In another embodiment of the present invention, a system for assembling a stacked semiconductor package is provided. The system for assembling the stacked semiconductor package includes a platform that holds a first substrate having first and second surfaces. The first surface includes a plurality of bond pads and one or more die pads. A means for forming a plurality of conductive bumps forms a plurality of conductive bumps on the plurality of bond pads. A means for attaching one or more semiconductor dies attaches one or more semiconductor dies on the one or more die pads. The system further includes a side-gate molding cast for receiving the first substrate. The molding cast covers the first surface of the first substrate, the one or more semiconductor dies, and the plurality of conductive bumps. A means for supplying a mold material supplies the mold material to the first surface of the first substrate. The mold material completely covers the semiconductor dies and at least partially covers the conductive bumps. A portion of each of the plurality of conductive bumps is exposed to provide electrical connection to a second semiconductor package. Thus, a first semiconductor package having a first boundary layer and a second boundary layer is formed. The first boundary layer is delineated by a first surface of the mold material and the exposed portion of the plurality of conductive bumps. The second boundary layer is delineated by the second surface of the first substrate.

Embodiments of the present invention provide a method and system for assembling a stacked semiconductor package. A side-gate molding process is used for supplying the mold material on the first surface, which mitigates risks induced due to the coherence of the mold material and, consequently increases package reliability. Additionally, the side gate molding process eliminates the need for placing a mold chase on the surface of the substrate, thereby allowing for increased substrate utilization and package efficiency. A cavity design of the die pad facilitates equal distribution of the mold material on the first surface of the substrate. The placement of the die in the cavity eliminates the need for large diameter conductive bumps, which advantageously reduces the profile of the semiconductor package and consequently, the overall profile of the stacked package. Additionally, the present invention facilitates the use of a uniform molding cast for molding semiconductor packages of varying specifications and sizes, which reduces the manufacturing cost of the semiconductor packages and provides enhanced flexibility in package design. In one embodiment of the invention, the molding cast also subjects the conductive bumps to variable deformation to affect a uniform profile of the semiconductor package.

Referring now to FIG. 2A, a top view of a substrate 200 in accordance with an embodiment of the present invention is shown. The substrate 200 may be comprise various forms, such as a tape substrate or a laminate substrate, and have multiple conductive and insulator layers, as is known in the art. The substrate 200 includes a die pad 202 that is located near a center of a first surface 206 of the substrate 200. In an embodiment of the present invention, as depicted in FIG. 2B, the die pad 202 includes a cavity that is configured to receive a semiconductor die. The substrate 200 further includes a plurality of bond pads such as bond pads 204, which are located near a periphery of the first surface 206 of the substrate 200. The first surface 206 is also referred to as the top surface or active surface of the substrate 200. In an exemplary embodiment of the present invention, the die pad 202 and the bond pads 204 may be made of copper.

Referring now to FIG. 2B, a schematic, cross-sectional side view diagram of the substrate 200 is shown, in accordance with an embodiment of the present invention. The substrate 200 also includes a plurality of substrate pads 208. The substrate pads 208 are electrically connected to the bond pads 204 with one or more plated-through holes, solid vias or some other conductors in the substrate 200 and are located on a second or bottom surface 210 of the substrate 200. In an embodiment of the present invention, the substrate pads 208 on the second surface 210 of the substrate 200 are exposed to provide electrical connections to allow for connection to one or more other semiconductor devices.

Referring now to FIGS. 3A-3F, schematic diagrams illustrating various stages of a fabrication process of a semiconductor package are shown, in accordance with an embodiment of the present invention.

Initially, as depicted in FIG. 3A, a plurality of conductive bumps 302, are formed on the bond pads 204 on the first surface 206 of the substrate 200. The conductive bumps 302 are made of a conductive material, such as a conductive metal. In one embodiment of the present invention, the conductive bumps 302 comprise solder balls. In various embodiments of the present invention, a means for forming the conductive bumps 302, such as bump attach machines (not shown), may be used to form the conductive bumps 302 on the bond pads 204. Examples of such bump attach machines include, but are not limited to, HANMI BMS-500 and MMS-MSA-250A.

Referring now to FIG. 3B, one or more semiconductor dies 304 is attached on the die pad 202 on the first surface 206 of the substrate 200. In various embodiments of the present invention, a means for attaching the semiconductor dies 304, such as a die bonder machine (not shown), may be used to attach the semiconductor die 304 on the die pad 202. Examples of suitable die bonder machines include, but are not limited to, an ESEC-2008 die bonder. As depicted in FIG. 3B, the semiconductor die 304 is attached on the die pad 202 such that a passive surface 304a of the semiconductor die 304 faces the inside of the die pad 202 and an active surface 304b of the semiconductor die 304 is substantially coplanar with the first surface 206 of the substrate 200.

Referring now to FIG. 3C, in one embodiment of the invention, the semiconductor die 304 is electrically connected to the substrate 200 using a wire bonding process. In an embodiment of the present invention, the means for attaching the semiconductor die 304 also electrically connects the semiconductor die 304 and the substrate 200 with a plurality of bond wires 306. The bond wires 306 may include gold, aluminum and/or copper wires, as is known in the art.

In various alternative embodiments of the present invention, the die pad 202 may be coplanar with the first surface 206 of the substrate 200 and a semiconductor die may be attached on the die pad 202 using the steps described with reference to FIGS. 3B and 3C.

In another embodiment of the present invention, the die pad 202 may be coplanar with the first surface 206, and accordingly, a semiconductor die may be attached and electrically connected on the die pad 202 using a flip chip technique. Further, various other processes such as tape automated bonding (TAB), may be used to attach and electrically connect the semiconductor die 304 with the substrate 200.

Referring now to FIGS. 3D and 3E, a side-gate molding cast 308 is placed above the conductive bumps 302 to cover the first surface 206 of the substrate 200, the conductive bumps 302, and the semiconductor die 304. As depicted in FIGS. 3D and 3E, the molding cast 308 has a planar surface that partially deforms the conductive bumps 302 as the molding cast 308 is pressed against the bumps 302.

Referring now to FIG. 3F, a mold material 310 is supplied to the first surface 206 of the substrate 200 while the molding cast 308 is maintained on the conductive bumps 302. In an embodiment of the present invention, the mold material 310 may include one of a resin, an epoxy, and a moisture resistant cyanide ester (MRCE). In various embodiments of the present invention, a means for supplying a mold material supplies the mold material to the first surface 206 of the substrate 200. The mold material 310 covers the semiconductor die 304. Further, due to the placement of the molding cast 308 above the conductive bumps 302, the mold material 310 at least partially covers the conductive bumps 302. A portion of the conductive bumps 302, i.e., exposed portion 312, is exposed to allow for electrical connection to another semiconductor package. As shown in FIG. 3F, the exposed portion 312 of the conductive bumps 302 is substantially coplanar with a first surface of the mold material 310.

Referring now to FIGS. 4A-4F, schematic diagrams illustrating various stages of the fabrication process of a semiconductor package in accordance with another embodiment of the present invention are shown.

Initially, as depicted in FIG. 4A, a plurality of conductive bumps 402 are formed on the bond pads 204 on the first surface 206 of the substrate 200. As shown in FIG. 4B, one or more semiconductor dies 404 is attached on the die pad 202 on the first surface 206 of the substrate 200. As depicted in FIG. 4B, the semiconductor die 404 is attached on the die pad 202 such that a passive surface 404a of the semiconductor die 404 faces and is attached to the die pad 202 and an active surface 404b of the semiconductor die 404 is substantially coplanar with the first surface 206 of the substrate 200.

Referring to FIG. 4C, the semiconductor die 404 is electrically connected with the substrate 200 with a plurality of bond wires 406.

Referring to FIGS. 4D and 4E, a side-gate type molding cast 408 is placed above the conductive bumps 302 to cover the first surface 206 of the substrate 200, the conductive bumps 402, and the die 404. The molding cast 408 includes a plurality of recesses 410 that receive at least a portion of the conductive bumps 402 that allow the bumps 402 to at least substantially maintain their oval shape even when the molding cast 408 is pressed down on the bumps 402.

Referring to FIG. 4F, a mold material 412 is supplied to the first surface 206 of the substrate 200 while the molding cast 408 is maintained on the conductive bumps 402. The mold material 412 covers the semiconductor die 404, and at least partially covers the conductive bumps 402 such that a portion of the conductive bumps 402, i.e., exposed portion 414, is not covered with the mold material 412, which allows for electrical connections to another semiconductor package (not shown). The exposed portion 414 of the conductive bumps 402 protrudes above the surface of the mold material 412.

Figure 5:
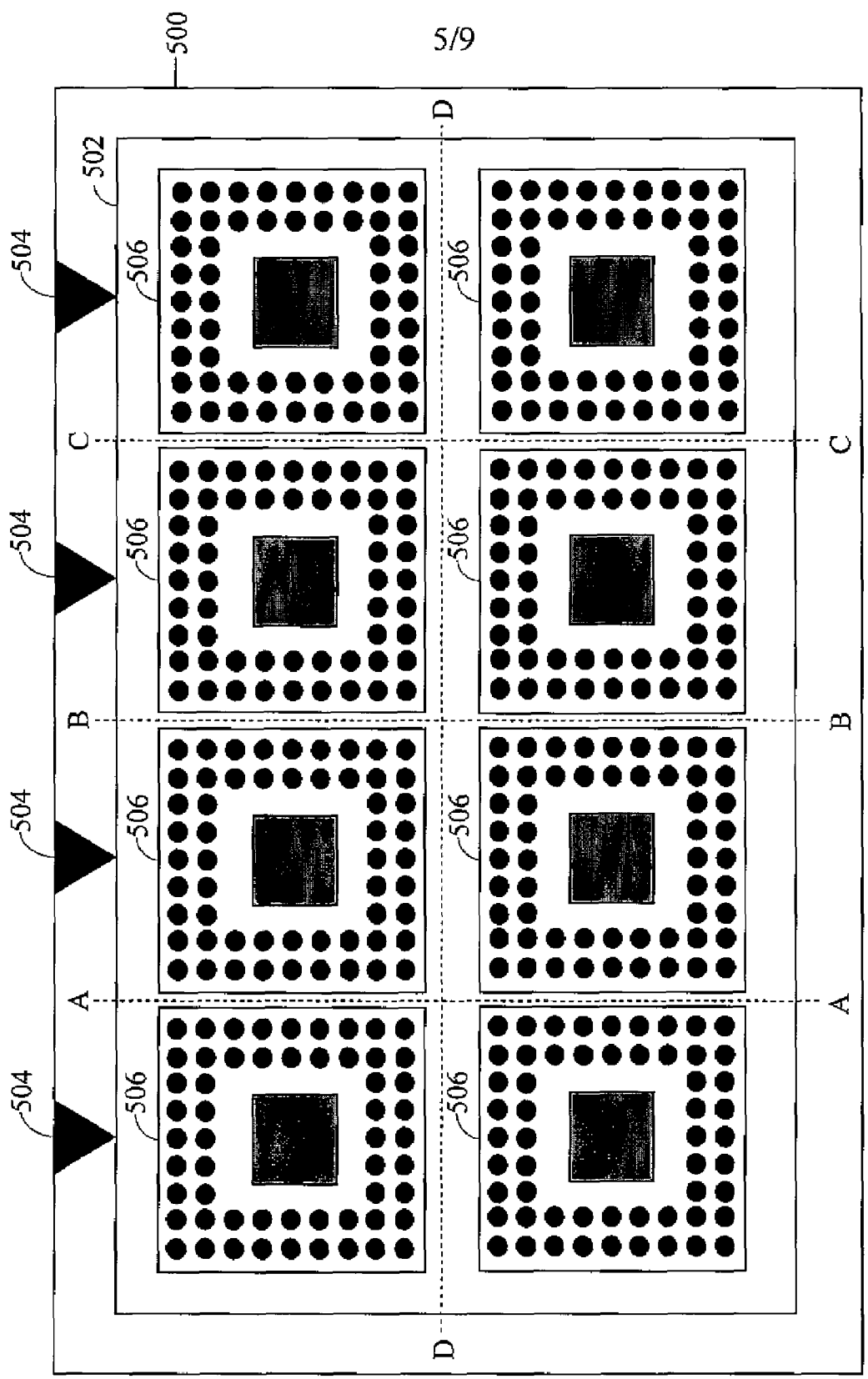
FIG. 5 is a schematic diagram illustrating a side-gate molding apparatus in accordance with an embodiment of the present invention.

Referring now to FIG. 5, a schematic diagram illustrating a side-gate molding apparatus 500 in accordance with an embodiment of the present invention is shown. The side-gate molding apparatus 500 includes a platform 502, and a plurality of gates 504. A plurality of substrates 506 is mounted on a top surface of the platform 502. In an embodiment of the present invention, each of the substrates 506 includes a plurality of conductive bumps formed thereon and at least one semiconductor die attached to each substrate 506. The die is electrically connected with the substrate through electrical interconnections. A common molding cast, such as the molding casts 308 or 408 (discussed above), is placed above the conductive bumps of the substrates 506. Thereafter, the mold material is supplied by way of the gates 504 to a first surface of the substrates 506. The mold material is spread uniformly over the first surface of the substrates 506 by capillary action. Although four gates 504 and eight substrates are shown, it will be understood by those of skill in the art that the molding apparatus may include fewer or more gates, and fewer or more substrates may be put into the molding apparatus 500.

In accordance with various embodiments of the present invention, a singulating operation may be performed along separation lines A-A, B-B, C-C, and D-D with a saw (not shown) to separate the substrates 506 from each other. The saw may include thin nozzle that is used to singulate the substrates 506. However, it will be appreciated by those skilled in the art that the present invention is not limited by the singulation technique employed. For example, the substrate 200 may also be singulated by punching or laser cutting or other suitable singulation methods in alternative embodiments.

Figure 6B:
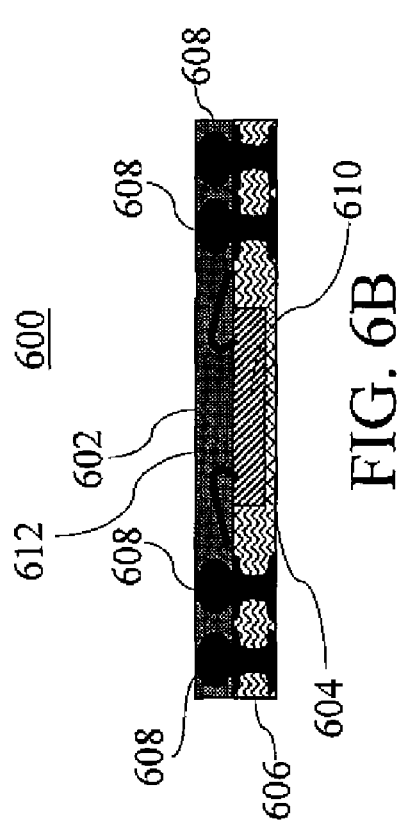
FIG. 6B is a cross-sectional side view of the semiconductor package of FIG. 6A cut along lines A-A.
Figure 6C:
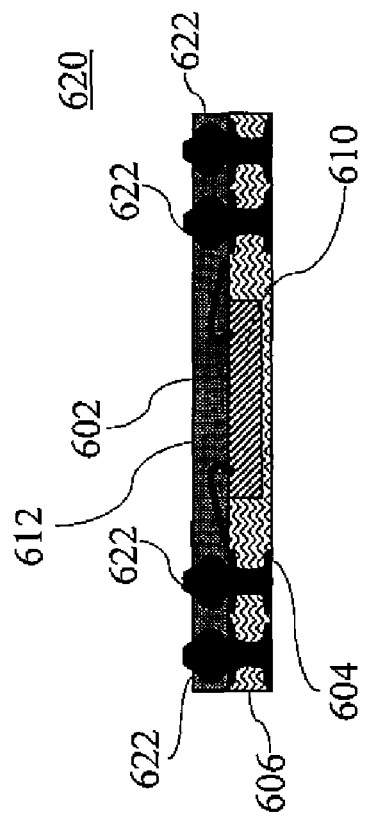
FIG. 6C is a cross-sectional side view of a semiconductor package in accordance with another embodiment of the present invention.
Figure 6A:
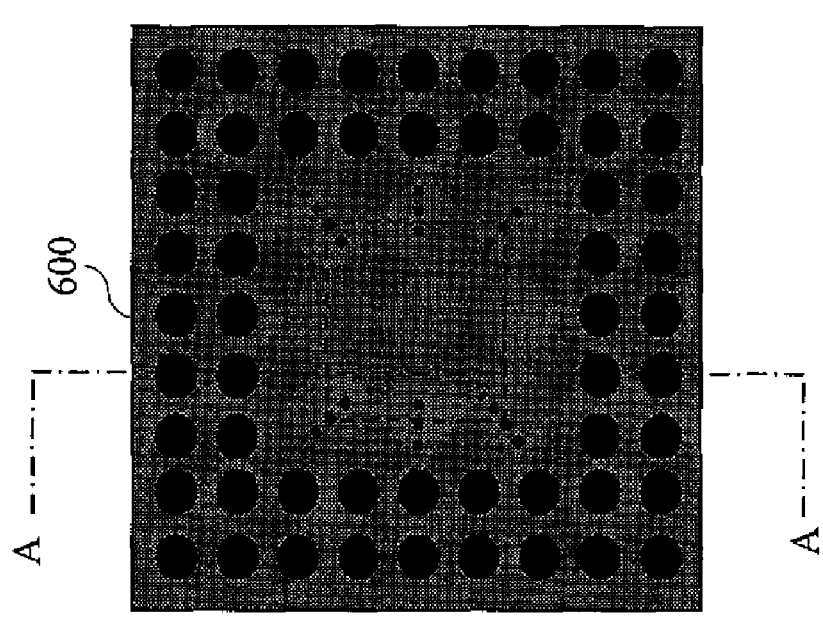
FIG. 6A is a top view of a semiconductor package, in accordance with an embodiment of the present invention.

Referring now to FIGS. 6A and 6B, schematic diagrams illustrating a top view and a cross-sectional side view, respectively, of a semiconductor package 600 are shown, in accordance with an embodiment of the present invention. The semiconductor package 600 has a first boundary layer 602 and a second boundary layer 604. The semiconductor package 600 includes a substrate 606, a plurality of conductive bumps 608 formed on the substrate 606, and a semiconductor die 610 attached on the substrate 606. A mold material 612 covers the semiconductor die 610 and at least partially covers the conductive bumps 608, with a portion of the conductive bumps being exposed for providing electrical connections to another semiconductor package. The first boundary layer 602 is delineated by a first surface of the mold material 612 and the exposed portion of the conductive bumps 608, and the second boundary layer 604 is delineated by a second surface of the substrate 606. As shown in FIG. 6B, the exposed portions of each of the conductive bumps 608 is substantially coplanar with the first surface of the mold material 612 on the first boundary layer 602.

FIG. 6C is a schematic diagram illustrating a cross-sectional side view of a semiconductor package 620, in accordance with an alternate embodiment of the present invention. Similar to the package 600, the package 620 includes first and second boundary layers 602 and 604, the substrate 606, the semiconductor die 610 attached on the substrate 606, and the mold material 612 that covers the substrate 606 and the semiconductor die 610. The package 620 also includes exposed conductive bumps 622 that partially protrude from the mold material 612 and above the first boundary layer 602.

Figure 7B:
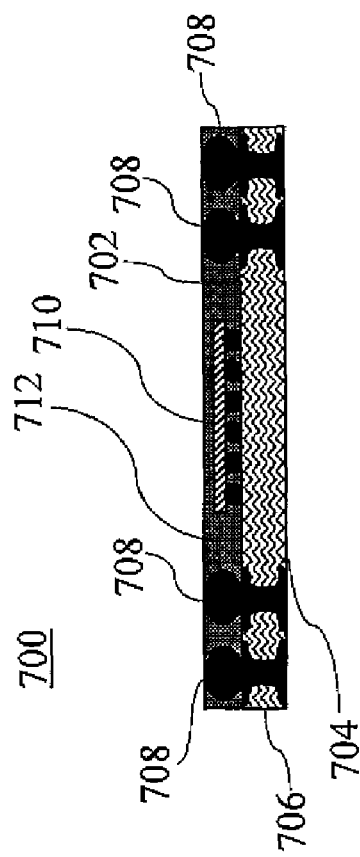
FIG. 7B is a cross-sectional side view of the semiconductor package of FIG. 7A.
Figure 7A:
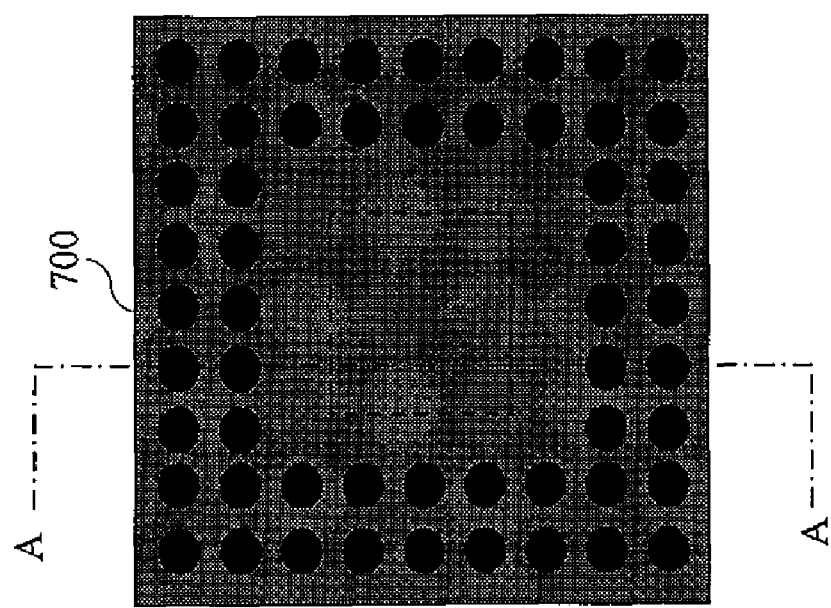
FIG. 7A is a top view of a semiconductor package, in accordance with an alternate embodiment of the present invention.

Referring now to FIGS. 7A and 7B, schematic diagrams illustrating a top view and a cross-sectional side view, respectively, of a semiconductor package 700 are shown, in accordance with an alternate embodiment of the present invention. The semiconductor package 700 has a first boundary layer 702 and a second boundary layer 704, which are like the boundary layers 602 and 604 of the package 600 shown in FIGS. 6A and 6B. The semiconductor package 700 also includes a substrate 706, a plurality of conductive bumps 708 formed on the substrate 706, and a semiconductor die 710 attached to a surface of the substrate 606. As depicted in FIG. 7B, the semiconductor die 710 is a flip-chip type die and is attached and electrically connected to the substrate 706 by facing the active surface of the die face-down, as is known by those of skill in the art. A mold material 712 covers the semiconductor die 710 and at least partially covers the conductive bumps 708, with a portion of the conductive bumps being exposed for providing electrical connections to another semiconductor package. As shown in FIG. 7B, the exposed portions of the conductive bumps 708 are substantially coplanar with a first surface of the mold material 712 on the first boundary layer 702. However, in other embodiments of the present invention, the exposed portions of each of the conductive bumps 708 may protrude from the first surface of the mold material 712 on the first boundary layer 702.

Figures 8A, 8B:
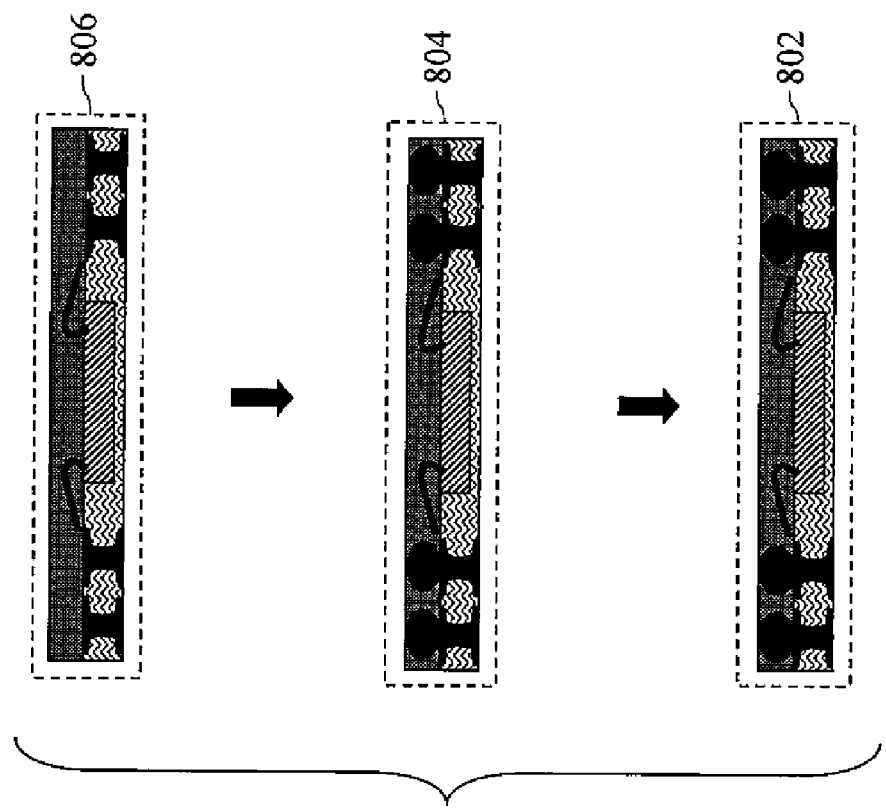
FIGS. 8A and 8B are schematic diagrams illustrating the assembly of a stacked semiconductor package in accordance with an exemplary embodiment of the present invention.

Referring now to FIGS. 8A and 8B, schematic diagrams illustrating the assembly of a stacked semiconductor package 800 are shown, in accordance with an exemplary embodiment of the present invention. The stacked semiconductor package 800 includes a plurality of semiconductor packages, in this case three semiconductor packages 802, 804 and 806. The packages 802 and 804 in the embodiment shown are like the package 600 shown in FIGS. 6A and 6B. However, packages like the packages 620 and 700, described above, may be similarly stacked. The semiconductor package 806 is the top-most package in the stack. Hence, the conductive bumps are not formed on the bonds pads of the substrate of the semiconductor package 802.

The semiconductor packages 802, 804 and 806 are placed one over the other such that they are in direct electrical contact with each other by way of their respective conductive bumps. Machines for stacking semiconductor packages are known in the art. For example, Siemens SIPLACE X4i chip shooter may be used to stack the semiconductor packages one above the other. Although FIGS. 8A and 8B show a stacked semiconductor package including three semiconductor packages, it will be apparent that any desired number of semiconductor packages may be stacked.

Figure 9:
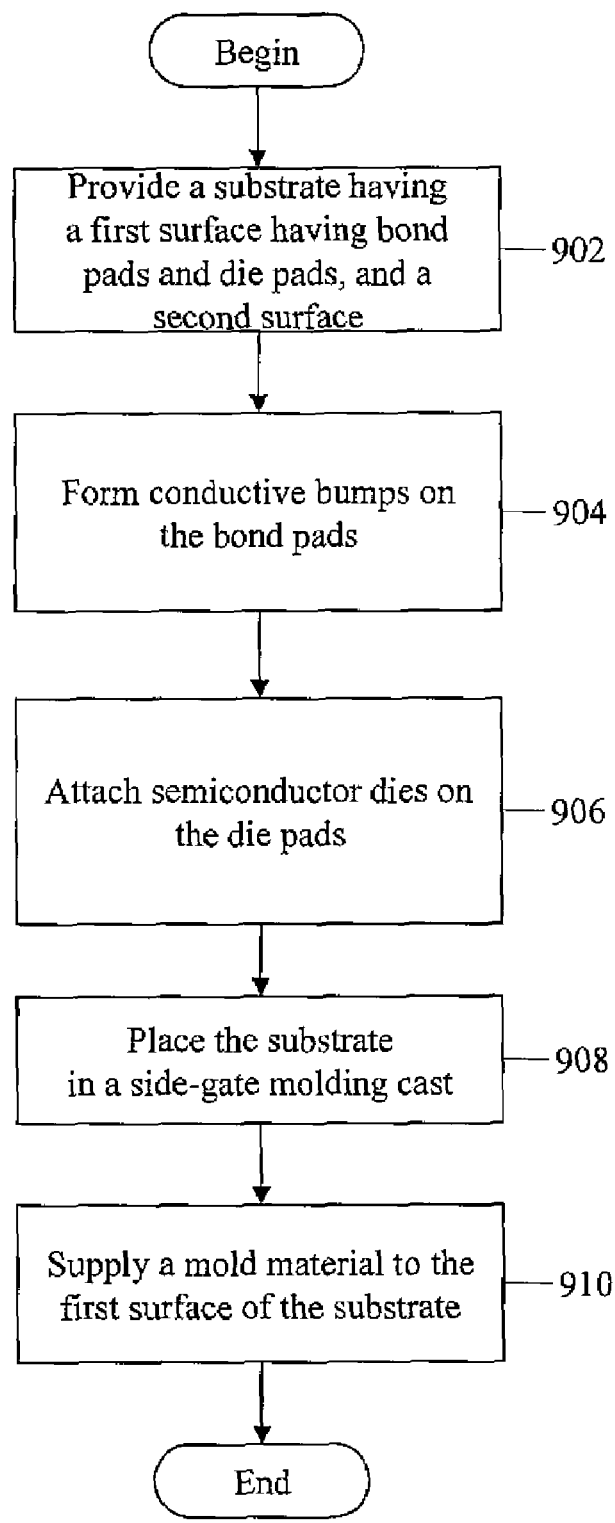
FIG. 9 is a flowchart illustrating a method for assembling a stacked semiconductor package in accordance with an embodiment of the present invention.

Referring now to FIG. 9, a flowchart illustrating a method for assembling a stacked semiconductor package is shown, in accordance with an embodiment of the present invention.

At step 902, a substrate having a first surface and a second surface is provided. The first surface of the substrate includes a plurality of bond pads and one or more die pads. In an embodiment of the present invention, the bonds pads are located near a periphery of the substrate and surround the die pads. In another embodiment of the present invention, at least one of the die pads comprises a cavity that is sized and shaped to receive a semiconductor die.

At step 904, a plurality of conductive bumps are formed on the plurality of bond pads. In an embodiment of the present invention, the conductive bumps are metallic balls such as solder balls. In another embodiment of the present invention, the conductive bumps are formed using bump attach machines, as discussed above with reference to FIG. 3A.

At step 906, one or more semiconductor dies are attached on the die pads on the first surface of the substrate. In an embodiment of the present invention, a semiconductor die is attached to a die pad such that a passive surface of the semiconductor die faces the inside of the die pad and an active surface of the semiconductor die remains substantially coplanar with the first surface of the substrate. In various embodiments of the present invention, the semiconductor die and the substrate are attached and electrically connected using at least one of a wire bonding process and a tape automated bonding (TAB) process.

At step 908, the substrate is placed in a side-gate type molding cast. The molding cast covers the first surface of the substrate, the conductive bumps and the semiconductor die. In an embodiment of the present invention, the molding cast may have a planar design to partially deform the conductive bumps. In another embodiment of the present invention, the molding cast includes a plurality of recesses to receive at least a portion of the conductive bumps.

At step 910, a mold material is supplied to the first surface of the substrate via the side gates. The mold material may include one of a resin, an epoxy, and a moisture resistant cyanide ester (MRCE). The mold material covers the semiconductor die and partially covers the conductive bumps, with a portion of each of the conductive bumps being exposed to provide electrical connection to another semiconductor package. In an embodiment of the present invention, the exposed portion of each of the conductive bumps may be substantially coplanar with a first surface of the mold material. In another embodiment of the present invention, the exposed portion of each of the conductive bumps may protrude from the first surface of the mold material. Thus, a first semiconductor package, such as the semiconductor package 600, having a first boundary layer and a second boundary layer is formed.

In various embodiments of the present invention, a stacked semiconductor package is formed by stacking a second semiconductor package above the first boundary layer of the first semiconductor package. The second semiconductor package includes a third boundary layer and a fourth boundary layer. The fourth boundary layer of the second semiconductor package is stacked above the first boundary layer of the first semiconductor package such that they are in direct electrical contact with each other.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claim is:

1. A method for assembling a stackable semiconductor package, comprising:
   providing a substrate having a first surface and a second surface, wherein the first surface comprises a plurality of bond pads and one or more die pads for attaching one or more semiconductor dies;
   attaching the one or more semiconductor dies on the one or more die pads;
   forming a plurality of conductive bumps on the plurality of bond pads;
   placing the substrate in a side-gate molding cast, such that the molding cast surrounds the first surface of the substrate, the one or more semiconductor dies and the plurality of conductive bumps; and
   supplying a mold material to the first surface of the substrate via side-gates of the molding cast, wherein the mold material covers the one or more semiconductor dies and at least partially covers the plurality of conductive bumps, wherein a portion of each of the plurality of conductive bumps is exposed for providing electrical connection to a second semiconductor package, whereby, a first semiconductor package comprising a first boundary layer and a second boundary layer is formed, the first boundary layer being delineated by a first surface of the mold material and the exposed portion of the plurality of conductive bumps and the second boundary layer being delineated by the second surface of the substrate.

2. The method for assembling a stackable semiconductor package of claim 1, wherein the die pads each include a cavity to receive a semiconductor die, wherein a passive surface of the semiconductor die faces the inside of the cavity and an active surface of the semiconductor die is substantially coplanar with the first surface of the substrate.

3. The method for assembling a stackable semiconductor package of claim 1, wherein attaching the one or more semiconductor dies further comprises electrically connecting the one or more semiconductor dies and the substrate using at least one of a wire bonding process and a Tape Automated Bonding (TAB) process.

4. The method for assembling a stackable semiconductor package of claim 1, wherein the one or more semiconductor dies are attached on the one or more die pads using a flip chip technique.

5. The method for assembling a stackable semiconductor package of claim 1, wherein the molding cast comprises a plurality of recesses to receive at least a portion of the plurality of conductive bumps, such that the exposed portion of each of the plurality of conductive bumps protrudes from the first surface of the mold material on the first boundary layer.

6. The method for assembling a stackable semiconductor package of claim 1, wherein the molding cast has a planar design to partially deform the plurality of conductive bumps, such that the exposed portion of each of the plurality of conductive bumps is substantially coplanar with the first surface of the mold material on the first boundary layer.

7. The method for assembling a stackable semiconductor package of claim 1, wherein the mold material comprises one of a resin, an epoxy and a Moisture Resistant Cyanide Ester (MRCE).

8. A system for assembling a stackable semiconductor package, comprising:

a platform for holding a substrate, the substrate having a first surface and a second surface, wherein the first surface comprises a plurality of bond pads and one or more die pads for attaching one or more semiconductor dies;

means for forming a plurality of conductive bumps on the plurality of bond pads on the first surface of the substrate;

means for attaching the one or more semiconductor dies on the one or more die pads on the first surface of the substrate;

a side-gate molding cast for receiving the substrate, wherein the molding cast covers the first surface of the substrate, the one or more semiconductor dies and the plurality of conductive bumps; and means for supplying a mold material to the first surface of the substrate by way of the side-gates, wherein the mold material completely covers the one or more semiconductor dies and partially covers the plurality of conductive bumps, wherein a portion of each of the plurality of conductive bumps is exposed for providing electrical connection to a second semiconductor package, whereby, a semiconductor package comprising a first boundary layer and a second boundary layer is formed, the first boundary layer being delineated by a first surface of the mold material and the exposed portion of the plurality of conductive bumps and the second boundary layer being delineated by the second surface of the substrate.

9. The system for assembling a stackable semiconductor package of claim 8, wherein the one or more die pads each includes a cavity for receiving the semiconductor dies, wherein a passive surface of the semiconductor die faces the inside of the cavity and an active surface of the semiconductor die is substantially coplanar with the first surface of the first substrate.

10. The system for assembling a stackable semiconductor package of claim 9, wherein the means for attaching the one or more semiconductor dies electrically connects the one or more semiconductor dies and first substrate using at least one of a wire bonding process and a Tape Automated Bonding (TAB) process.

11. The system for assembling a stackable semiconductor package of claim 9, wherein the means for attaching the one or more semiconductor dies attaches the one or more semiconductor dies using a flip chip technique.

12. The system for assembling a stackable semiconductor package of claim 9, wherein the molding cast comprises a plurality of recesses to receive at least one portion of the plurality of conductive bumps, such that the exposed portion of each of the plurality of conductive bumps protrudes from the first surface of the mold material on the first boundary layer.

13. The system for assembling a stackable semiconductor package of claim 9, wherein the molding cast has a planar design to partially deform the plurality of conductive bumps, such that the exposed portion of each of the plurality of conductive bumps is substantially coplanar with the first surface of the mold material on the first boundary layer.

14. The system for assembling a stackable semiconductor package of claim 9, wherein the mold material comprises one of a resin, an epoxy and a Moisture Resistant Cyanide Ester (MRCE).

* * * * *